(12) United States Patent
Dunn et al.

(10) Patent No.: US 10,194,564 B2
(45) Date of Patent: Jan. 29, 2019

(54) BACK TO BACK ELECTRONIC DISPLAY ASSEMBLY

(71) Applicant: Manufacturing Resources International, Inc., Alpharetta, GA (US)

(72) Inventors: William Dunn, Alpharetta, GA (US); Marcos Diaz, Alpharetta, GA (US); Kyle Azevedo, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 14/700,519

(22) Filed: Apr. 30, 2015

(65) Prior Publication Data

US 2015/0319882 A1    Nov. 5, 2015

Related U.S. Application Data

(60) Provisional application No. 61/986,724, filed on Apr. 30, 2014.

(51) Int. Cl.
*H05K 5/00* (2006.01)
*H05K 7/20* (2006.01)
(Continued)

(52) U.S. Cl.
CPC ....... *H05K 7/20972* (2013.01); *F21V 29/677* (2015.01); *G02F 1/133385* (2013.01);
(Continued)

(58) Field of Classification Search
CPC ............... F21V 29/677; F21Y 2101/02; G02F 1/133604; G02F 1/605; G02F 1/606;
(Continued)

(56) References Cited

U.S. PATENT DOCUMENTS 4,093,355 A    6/1978 Kaplit et al.
4,593,978 A    6/1986 Mourey et al.
(Continued)

FOREIGN PATENT DOCUMENTS

AU    2011248190 B2    5/2011
AU    2014287438 B2    1/2018
(Continued)

OTHER PUBLICATIONS

Zeef, Hubing, EMC analysis of 18' LCD Monitor, Aug. 2000, 1 page.
(Continued)

*Primary Examiner* — Peggy A Neils
(74) *Attorney, Agent, or Firm* — Standley Law Group LLP

(57) ABSTRACT

The exemplary embodiments herein comprise a back to back electronic display assembly having a first display assembly positioned back to back with a second display assembly. A plenum is preferably positioned in between the first and second display assemblies with a first gap defined between the plenum and the first display assembly and a second gap defined between the plenum and the second display assembly. A fan is preferably positioned to force air through the first and second gaps. A plenum fan may be used to circulate air around the plenum. Preferably, the second display assembly can move relative to the first display assembly to provide access to the interior of the plenum.

13 Claims, 6 Drawing Sheets

(51) Int. Cl.
*F21V 29/67* (2015.01)
*F21Y 115/10* (2016.01)
*G02F 1/1333* (2006.01)

(52) U.S. Cl.
CPC ....... H05K 5/0017 (2013.01); H05K 7/20145 (2013.01); *F21Y 2115/10* (2016.08)

(58) Field of Classification Search
CPC .. G02F 1/608; H05K 7/20145; H05K 5/0017; H05K 7/20972; H05K 7/202; H05K 7/20209; H05K 5/0021; G02G 1/133385; G02G 2001/133342; G02G 2201/136
USPC .............................................. 362/97.1, 97.2
See application file for complete search history.

(56) References Cited

U.S. PATENT DOCUMENTS

| | | |
|---|---|---|
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 5,029,982 A | 7/1991 | Nash |
| 5,088,806 A | 2/1992 | McCartney et al. |
| 5,132,666 A | 7/1992 | Fahs |
| 5,247,374 A | 9/1993 | Terada |
| 5,282,114 A | 1/1994 | Stone |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,991,153 A | 11/1999 | Heady et al. |
| 6,003,015 A | 12/1999 | Kang et al. |
| 6,007,205 A | 12/1999 | Fujimori |
| 6,089,751 A | 7/2000 | Conover et al. |
| 6,104,451 A | 8/2000 | Matsuoka et al. |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,437,673 B1 | 8/2002 | Nishida |
| 6,473,150 B1 | 10/2002 | Takushima et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,683,639 B2 | 1/2004 | Scheper |
| 6,714,410 B2 | 3/2004 | Wellhofer |
| 6,727,468 B1 | 4/2004 | Nemeth |
| 6,825,828 B2 | 11/2004 | Burke et al. |
| 6,839,104 B2 | 1/2005 | Taniguchi et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,587 B2 | 3/2007 | Kim et al. |
| 7,209,349 B2 | 4/2007 | Chien et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,452,121 B2 | 11/2008 | Cho et al. |
| 7,457,113 B2 | 11/2008 | Kumhyr et al. |
| 7,480,140 B2 | 1/2009 | Hara et al. |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,752,858 B2 | 7/2010 | Johnson et al. |
| 7,753,567 B2 | 7/2010 | Kang et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,465 B2 | 12/2011 | Nishiura |
| 8,102,173 B2 | 1/2012 | Merrow |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,418,387 B2 * | 4/2013 | Swatt ................ G09F 7/18 361/679.21 |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 * | 9/2014 | Takada ............... G02B 5/201 362/19 |
| 8,854,572 B2 | 10/2014 | Dunn |
| 8,854,595 B2 | 10/2014 | Dunn |
| 8,879,042 B2 | 11/2014 | Dunn |
| 8,976,313 B2 * | 3/2015 | Kim ............... G02F 1/133382 349/58 |
| 8,988,647 B2 | 3/2015 | Hubbard |

(56) References Cited

U.S. PATENT DOCUMENTS

| | | |
|---|---|---|
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,370,127 B2 | 6/2016 | Dunn |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,723,765 B2 | 8/2017 | DeMars |
| 2001/0001459 A1 | 5/2001 | Savant et al. |
| 2001/0019454 A1 | 9/2001 | Tadic-Galeb et al. |
| 2002/0033919 A1 | 3/2002 | Sanelle et al. |
| 2002/0101553 A1 | 8/2002 | Enomoto et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035558 A1 | 2/2004 | Todd et al. |
| 2004/0036834 A1 | 2/2004 | Ohnishi et al. |
| 2004/0103570 A1 | 6/2004 | Ruttenberg |
| 2004/0105159 A1 | 6/2004 | Saccomanno et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0229630 A1 | 10/2005 | Richter et al. |
| 2005/0237714 A1 | 10/2005 | Ebermann |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0082271 A1 | 4/2006 | Lee et al. |
| 2006/0092346 A1 | 5/2006 | Moon |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0269216 A1 | 11/2006 | Wiemeyer |
| 2006/0283579 A1 | 12/2006 | Ghosh et al. |
| 2007/0019419 A1 | 1/2007 | Hafuka et al. |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2009/0009729 A1 | 1/2009 | Sakai |
| 2009/0086430 A1 | 4/2009 | Kang et al. |
| 2009/0120629 A1 | 5/2009 | Ashe |
| 2009/0126906 A1 | 5/2009 | Dunn |
| 2009/0126907 A1 | 5/2009 | Dunn |
| 2009/0126914 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0244472 A1 | 10/2009 | Dunn |
| 2009/0279240 A1 | 11/2009 | Karppanen |
| 2009/0306820 A1 | 12/2009 | Simmons et al. |
| 2010/0060861 A1 | 3/2010 | Medin |
| 2010/0079949 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1* | 9/2010 | Dunn ................ G02F 1/133385 349/161 |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0051071 A1 | 3/2011 | Nakamichi et al. |
| 2011/0058326 A1 | 3/2011 | Idems et al. |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1* | 4/2011 | Dunn ................ G02F 1/133385 361/695 |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1* | 6/2011 | Swatt ........................ G09F 7/18 349/58 |
| 2011/0141724 A1 | 6/2011 | Erion |
| 2011/0261523 A1 | 10/2011 | Dunn et al. |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |

(56) References Cited

U.S. PATENT DOCUMENTS

| | | | |
|---|---|---|---|
| 2012/0020114 | A1 | 1/2012 | Miyamoto et al. |
| 2012/0038849 | A1 | 2/2012 | Dunn et al. |
| 2012/0044217 | A1 | 2/2012 | Okada et al. |
| 2012/0106081 | A1 | 5/2012 | Hubbard et al. |
| 2012/0206687 | A1 | 8/2012 | Dunn et al. |
| 2012/0249402 | A1 | 10/2012 | Kang |
| 2012/0255704 | A1 | 10/2012 | Nakamichi |
| 2012/0274876 | A1 | 11/2012 | Cappaert et al. |
| 2012/0284547 | A1 | 11/2012 | Culbert et al. |
| 2013/0170140 | A1 | 7/2013 | Dunn |
| 2013/0201685 | A1 | 8/2013 | Messmore et al. |
| 2013/0258659 | A1 | 10/2013 | Erion |
| 2013/0294039 | A1 | 11/2013 | Chao |
| 2014/0044147 | A1* | 2/2014 | Wyatt .............. G01D 7/00 374/100 |
| 2014/0085564 | A1 | 3/2014 | Hendren et al. |
| 2014/0111758 | A1 | 4/2014 | Dunn et al. |
| 2014/0113540 | A1 | 4/2014 | Dunn et al. |
| 2014/0118221 | A1* | 5/2014 | Park .............. G09G 3/20 345/1.3 |
| 2014/0313698 | A1 | 10/2014 | Dunn et al. |
| 2014/0314395 | A1* | 10/2014 | Dunn .............. G11B 33/06 386/359 |
| 2015/0253611 | A1* | 9/2015 | Yang .............. G02F 1/133308 349/58 |
| 2015/0264826 | A1 | 9/2015 | Dunn et al. |
| 2015/0319882 | A1 | 11/2015 | Dunn et al. |
| 2015/0366101 | A1 | 12/2015 | Dunn et al. |
| 2016/0041423 | A1 | 2/2016 | Dunn |
| 2016/0044829 | A1 | 2/2016 | Dunn |
| 2016/0192536 | A1 | 6/2016 | Diaz |
| 2016/0195254 | A1 | 7/2016 | Dunn et al. |
| 2016/0198588 | A1 | 7/2016 | DeMars |
| 2016/0238876 | A1 | 8/2016 | Dunn et al. |
| 2016/0242329 | A1 | 8/2016 | DeMars |
| 2016/0242330 | A1 | 8/2016 | Dunn |
| 2016/0249493 | A1 | 8/2016 | Dunn et al. |
| 2016/0302331 | A1 | 10/2016 | Dunn |
| 2017/0023823 | A1 | 1/2017 | Dunn et al. |
| 2017/0068042 | A1 | 3/2017 | Dunn et al. |
| 2017/0074453 | A1 | 3/2017 | Bowers et al. |
| 2017/0083043 | A1 | 3/2017 | Bowers et al. |
| 2017/0083062 | A1 | 3/2017 | Bowers et al. |
| 2017/0111486 | A1 | 4/2017 | Bowers et al. |
| 2017/0111520 | A1 | 4/2017 | Bowers et al. |
| 2017/0111521 | A1 | 4/2017 | Bowers et al. |
| 2017/0127579 | A1 | 5/2017 | Hubbard |
| 2017/0188490 | A1 | 6/2017 | Dunn et al. |
| 2017/0245400 | A1 | 8/2017 | Dunn et al. |
| 2017/0257978 | A1 | 9/2017 | Diaz |

FOREIGN PATENT DOCUMENTS

| | | |
|---|---|---|
| CN | 2702363 Y | 5/2005 |
| EP | 1408476 A1 | 4/2004 |
| EP | 1647766 | 4/2006 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3117693 A2 | 1/2017 |
| GB | 2402205 | 12/2004 |
| GB | 2402205 A | 12/2004 |
| JP | 402062015 A | 3/1990 |
| JP | 402307080 A | 12/1990 |
| JP | 03153212 | 7/1991 |
| JP | 3153212 A | 7/1991 |
| JP | H06-2337 U | 1/1994 |
| JP | 6082745 A | 3/1994 |
| JP | 8115788 A | 5/1996 |
| JP | 08194437 | 7/1996 |
| JP | 8194437 A | 7/1996 |
| JP | H08-305301 A | 11/1996 |
| JP | 8339034 A | 12/1996 |
| JP | H09246766 A | 9/1997 |
| JP | 11160727 | 6/1999 |
| JP | 11160727 A | 6/1999 |
| JP | 11296094 | 10/1999 |
| JP | H11296094 A | 10/1999 |
| JP | 2001209126 | 8/2001 |
| JP | 2001209126 A | 8/2001 |
| JP | 2002158475 | 5/2002 |
| JP | 2002158475 A | 5/2002 |
| JP | 2004053749 A | 2/2004 |
| JP | 2005017556 A | 1/2005 |
| JP | 2000131682 A | 5/2005 |
| JP | 2005134849 | 5/2005 |
| JP | 2005134849 A | 5/2005 |
| JP | 2005-265922 | 9/2005 |
| JP | 2005265922 A | 9/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2007003638 A | 1/2007 |
| JP | 2007-293105 A | 11/2007 |
| JP | 09307257 | 11/2007 |
| JP | 09307257 A | 11/2007 |
| JP | 2008010361 A | 1/2008 |
| JP | 2008292743 | 12/2008 |
| JP | 2008292743 A | 12/2008 |
| JP | 2010024624 | 2/2010 |
| JP | 2010024624 A | 2/2010 |
| JP | 2017518526 A | 7/2017 |
| KR | 200366674 Y1 | 11/2004 |
| KR | 20050033986 | 4/2005 |
| KR | 20050033986 A | 4/2005 |
| KR | 200401354 Y1 | 11/2005 |
| KR | 20060016469 | 2/2006 |
| KR | 20060016469 A | 2/2006 |
| KR | 100666961 | 1/2007 |
| KR | 100666961 B1 | 1/2007 |
| KR | 1020070070675 A | 4/2007 |
| KR | 1020070070675 | 7/2007 |
| KR | 1020070048294 | 8/2007 |
| KR | 101764381 B1 | 7/2017 |
| RU | 2513043 C2 | 4/2014 |
| WO | WO2005079129 | 8/2005 |
| WO | WO2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 | 11/2009 |
| WO | WO2009135308 A1 | 11/2009 |
| WO | WO2010-007821 | 1/2010 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | WO2014149773 A1 | 9/2014 |
| WO | WO2014150036 A1 | 9/2014 |
| WO | WO2015168375 A1 | 11/2015 |
| WO | WO2016102982 A1 | 6/2016 |
| WO | WO2016133852 A1 | 8/2016 |
| WO | WO2017152166 A1 | 9/2017 |

OTHER PUBLICATIONS

ITSENCLOSURES, Product Catalog, 2009, 48 pages.
ITSENCLOSURES, Standard Product Data Sheet, 2011, 18 pages.
SUNBRITETV, All Weather Outdoor LCD Television Model 4610HD, 2008, 1 page.

(56) References Cited

OTHER PUBLICATIONS

SUNBRITETV, Introduces Two New All-Weather Outdoor Televisions InfoComm 2008, 7 pages.
ITSENCLOSURES, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
*Civiq Smartscapes LLC.* V *Manufacturing Resources International, Inc.*, Defendant's Amended Answer and Countercliams to Plaintiff's First Amended Complaint, Filed Apr. 24, 2018, 240 pages.
Yung, Using Metal Core Printed Circuit Board as a Solution for Thermal Management article, 2007, 5 pages.
Civiq, Invalidity Claim Charts, Appendix F to H, Mar. 22, 2018, 18 pages.
Civiq, Invalidity Claim Charts, Appendix A-Appendix D, Jan. 24, 2018, 51 pages.
Civiq, Invalidity Claim Chart, Appendix I, Mar. 22, 2018, 4 pages.
Civiq, Invalidity Contentions, Jan. 24, 2018, 51 pages.
Mentley, David E., State of Flat-Panel Display Technology and Future Trends, Proceedings of the IEEE, Apr. 2002, vol. 90, No. 4, pp. 453-459.
Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC.* V *Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.

\* cited by examiner

BACK TO BACK ELECTRONIC DISPLAY ASSEMBLY

CROSS-REFERENCE TO RELATED APPLICATIONS

This application claims priority to U.S. Application No. 61/986,724 filed on Apr. 30, 2014 and is herein incorporated by reference in its entirety.

TECHNICAL FIELD

Embodiments generally relate to cooling systems and methods for installing electronic displays.

BACKGROUND OF THE ART

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures. In some spaces, only a small footprint is available, such that placing electronic displays in a back to back orientation is desirable.

SUMMARY OF THE EXEMPLARY EMBODIMENTS

Exemplary embodiments provide a back to back electronic display assembly where the electronic components are contained within a sealed plenum. External air is ingested and passed between the walls of the plenum and the rear surfaces of the electronic display assemblies. The two electronic display assemblies are permitted to move relative to one another, such that the plenum can be easily opened with the electronics made available for servicing and/or replacement.

The foregoing and other features and advantages of the present invention will be apparent from the following more detailed description of the particular embodiments, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1:
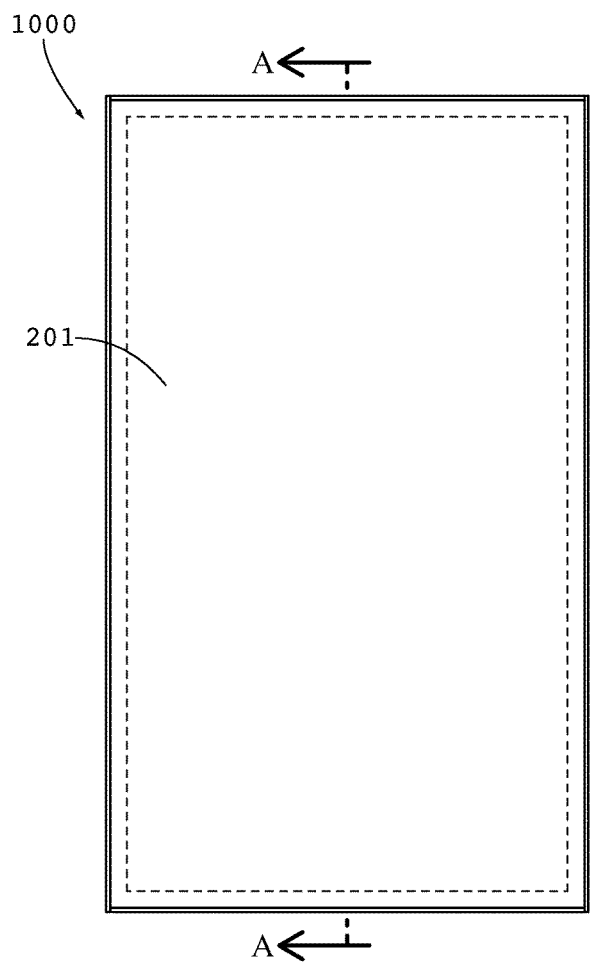
FIG. 1 is a front planar view of an exemplary back to back display assembly showing the vertical section line A-A.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a front planar view of an exemplary back to back display assembly 1000 showing the vertical section line A-A. In this orientation the first display assembly 201 is the only display that is viewable.

Figure 2:
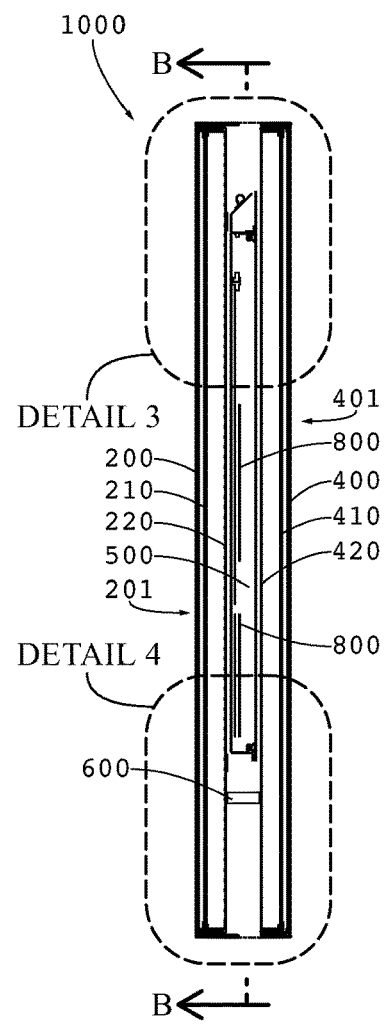
FIG. 2 is a section view taken along the section line A-A and showing Detail 3 and Detail 4 as well as vertical section line B-B.

FIG. 2 is a section view taken along the section line A-A and showing Detail 3 and Detail 4 as well as vertical section line B-B. A first display assembly 201 is positioned back-to-back with a second display assembly 401. In an exemplary embodiment, the two display assemblies 201 and 401 are substantially parallel with the rear surfaces of each display assembly facing each other. The first display assembly 201 preferably contains a front cover glass 200, LCD panel 210, and LED backlight 220. The second display assembly 401 preferably contains a front cover glass 400, LCD panel 410, and LED backlight 420. Although shown and described herein with LED backlight LCD technology, the exemplary embodiments herein can be practiced with any form of flat panel display, including but not limited to OLED, LED, plasma, and any luminescent polymers. In these embodiments, the rear surface of the LED backlight would simply be the rear surface of an OLED, LED, plasma, or a luminescent polymer display.

An enclosed plenum 500 preferably contains the electronics 800 for operating the two displays and is positioned between the two display assemblies 201 and 401. A fan 600 is also positioned between the two display assemblies 201 and 401 and is positioned to draw surrounding external air through the assembly 1000, preferably without permitting any of the external air to enter the plenum 500. Although only a single fan 600 is shown, multiple fans may be used in some embodiments, either in the same or a different location than the fan 600 which is shown. Further, while the fan 600 is shown pulling the external air through the assembly 1000, it could also be positioned to push the external air through the assembly 10000. Still further, although shown at the bottom of the display assembly 1000, it could instead be placed at the top.

Figure 3:
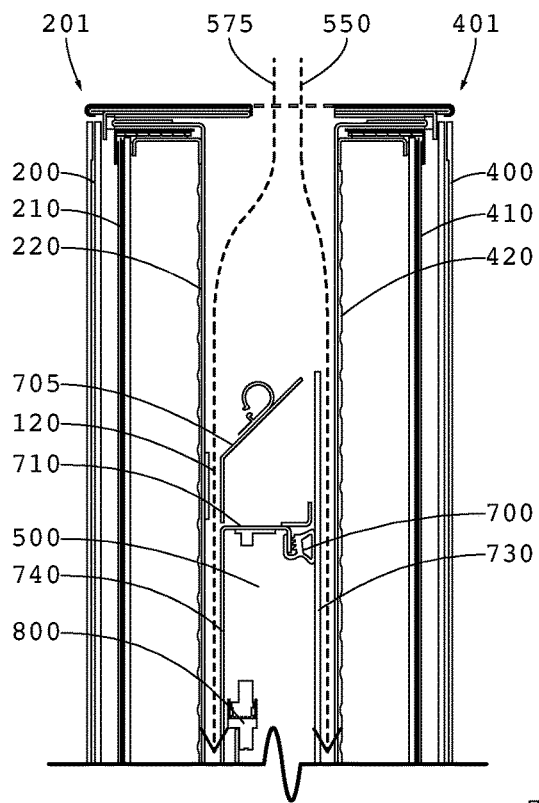
FIG. 3 is a detailed section view showing Detail 3.
Figure 4:
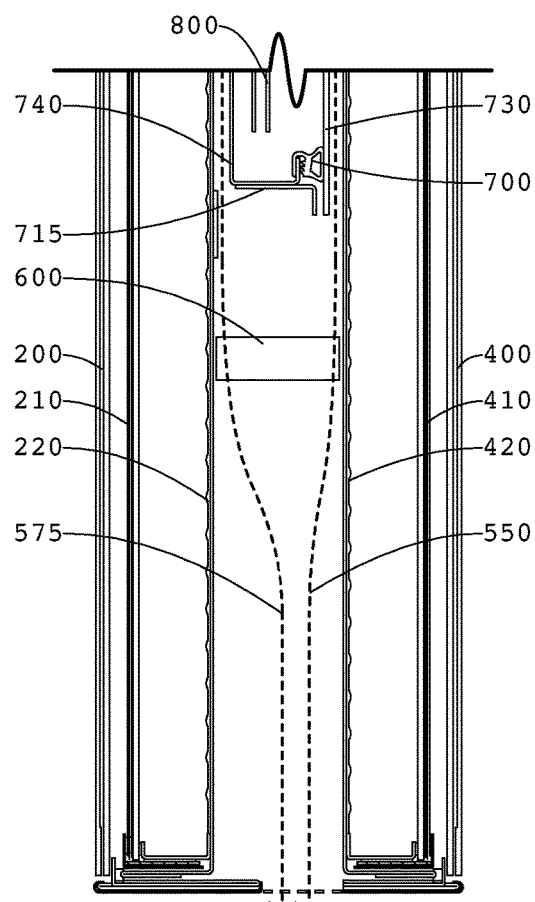
FIG. 4 is a detailed section view showing Detail 4.

FIG. 3 is a detailed section view showing Detail 3. FIG. 4 is a detailed section view showing Detail 4. The plenum 500 is preferably enclosed by a first wall 740 which faces the first display assembly 201, a second wall 730 which faces the second display assembly 401, a top wall 710, bottom wall 715, and a pair of opposing sidewalls 701 (not shown in this view). In this embodiment, the first wall 740, a top wall 710, bottom wall 715, and opposing sidewalls 701 are fixed relative to one another while the second wall 730 is movable relative to these pieces. While this is shown here, other embodiments could fix the second wall 730 relative to the top wall 710, bottom wall 715, and opposing sidewalls 701 while the first wall 740 is movable relative to these pieces. Preferably, the walls 740, 710, 715, 730, and the sidewalls 701 are metallic and preferably aluminum.

The second wall 730 seals the plenum 500 when the gasket 700 is compressed between the second wall 730 and the top wall 710, bottom wall 715, and opposing sidewalls 701. The electronics 800 contained within the plenum are protected from the external air flows 575 and 550 and any possible contaminates, particulate, or water vapor that may be present. The electronics can include, but are not limited to: power supplies, microprocessors, printed circuit boards, electronic memory, transmitting/receiving devices, and video players. Preferably the electronics 800 are also in thermal communication (preferably conductive) with either the first wall 740, second wall 730, or both. In this way, heat from the electronics 800 can be transferred to the first wall 740 to be removed by first external air flow 575 or the second wall 730 to be removed by the second external air flow 550.

A first gap is preferably defined between the first display assembly 201 and the first wall 740 of the plenum 500. A second gap is defined between the second display assembly 401 and the second wall 730 of the plenum 500. In this particular embodiment where an LCD with an LED backlight is being used, the first gap is between the rear surface of the LED backlight 220 and the first wall 740 and the second gap is between the rear surface of the LED backlight 420 and the second wall 730. A first external airflow 575 is ingested into the housing through an inlet aperture, forced through the first gap, and then exhausted out of the housing through an exhaust aperture. A second external airflow 550 is ingested into the housing through an inlet aperture, forced through the second gap, and then exhausted out of the housing through an exhaust aperture. In this way, airflow 575 can remove heat simultaneously from the LED backlight 220 and the first wall 740 while airflow 550 can remove heat simultaneously from the LED backlight 420 and the second wall 730.

Figure 5:
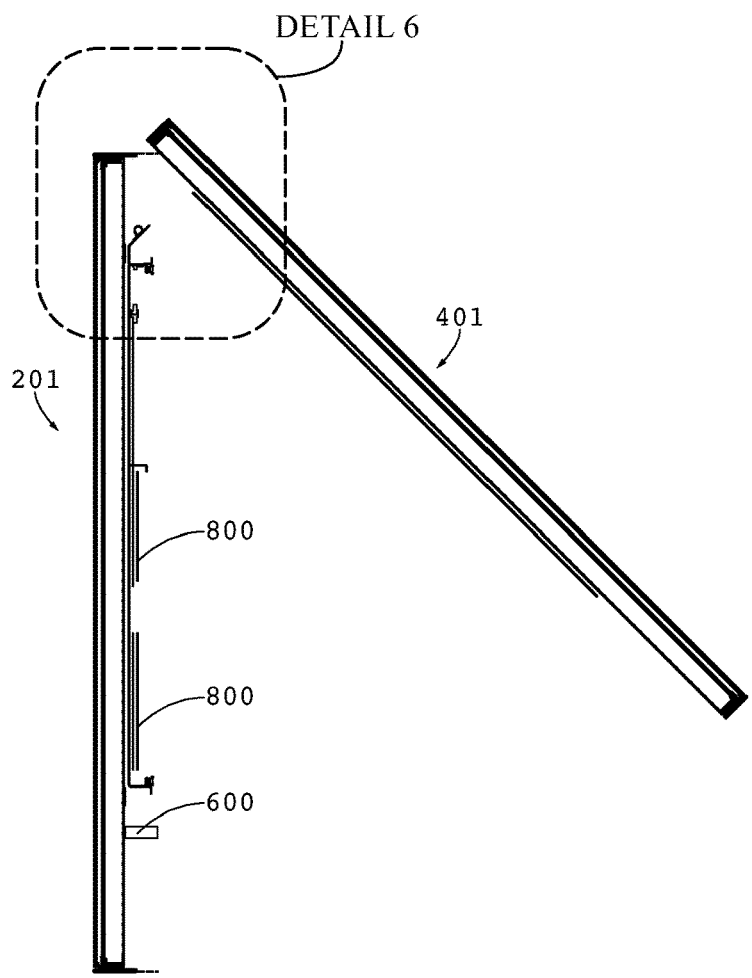
FIG. 5 is a section view taken along the section line A-A and showing the second display assembly rotated away from the first display assembly and also showing Detail 6.

FIG. 5 is a section view taken along the section line A-A and showing the second display assembly rotated away from the first display assembly and also showing Detail 6. In this embodiment, the first display assembly 201 remains fixed while the second display assembly 401 is permitted to move or rotate away from the first display assembly 201, providing access to the interior of the plenum and the electronics 800 inside.

Figure 6:
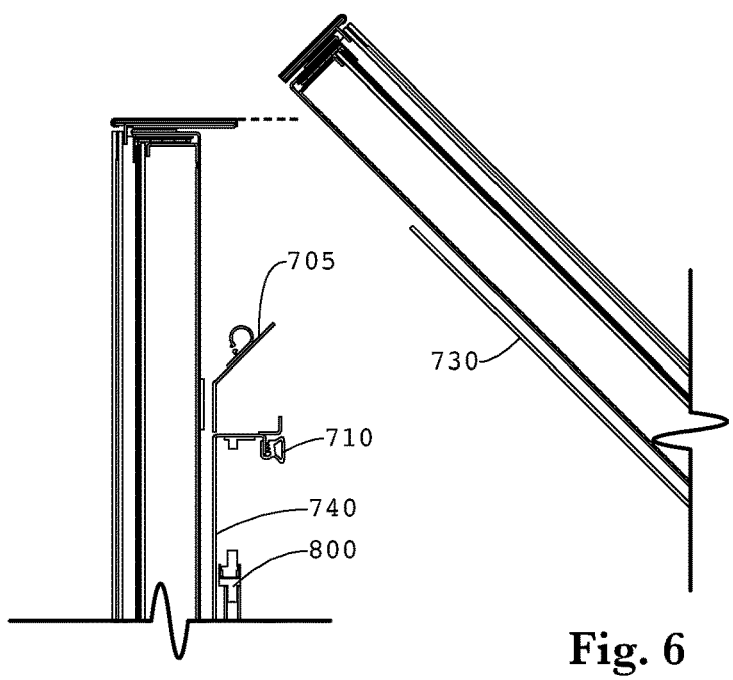
FIG. 6 is a detailed section view showing Detail 6.

FIG. 6 is a detailed section view showing Detail 6. Here, a sloped rain catcher 705 is placed below the inlet aperture and above the plenum so as to collect any condensation and direct it down the first gap. This figure also shows the movement of the second wall 730 along with the second display assembly 401, as they move away from the first wall 740, a top wall 710, bottom wall 715, and opposing sidewalls 701 to provide access to the interior of the plenum.

Figure 7:
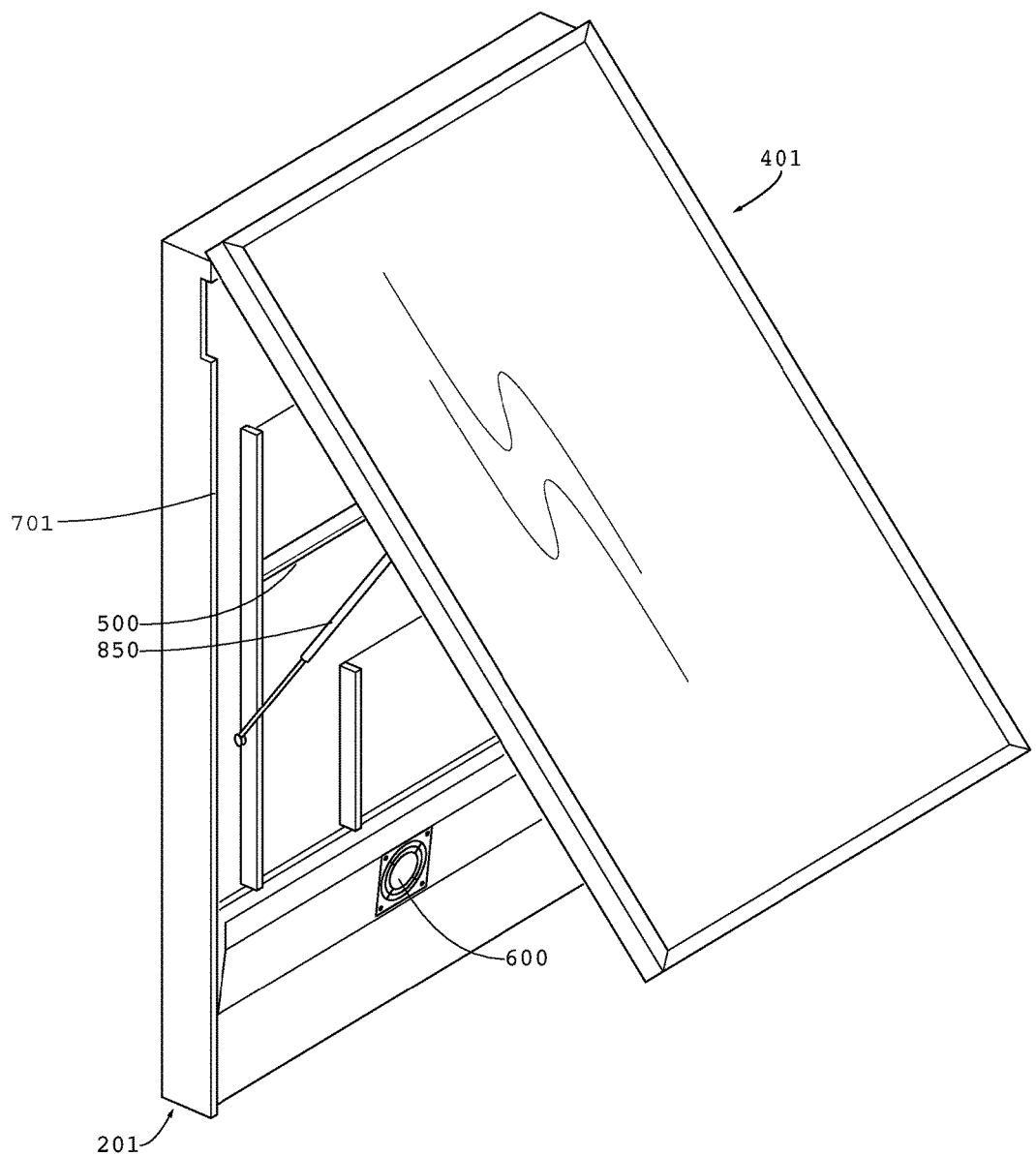
FIG. 7 is a perspective view showing an alternate embodiment where the first display assembly is rotated away from the second display assembly.

FIG. 7 is a perspective view showing an alternate embodiment where the first display assembly 201 is rotated away from the second display assembly 401 (which remains fixed). Here, a pair of gas springs 850 are used to help rotate the display assembly 201 and hold it in an open position while the interior of the plenum 500 is being serviced.

Figure 8:
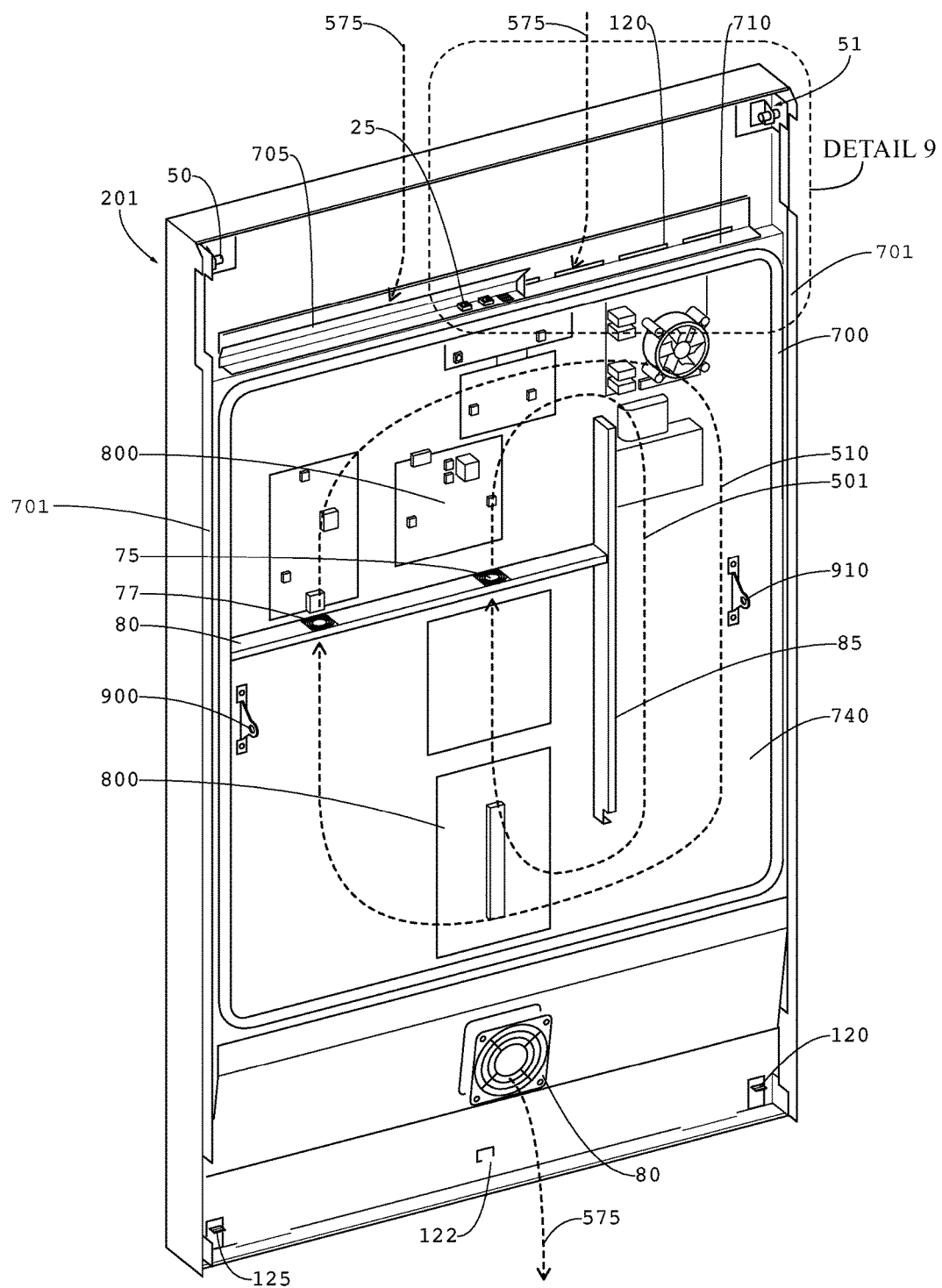
FIG. 8 is a perspective view taken along the line B-B and indicating Detail 9.

FIG. 8 is a perspective view taken along the line B-B and indicating Detail 9. In this embodiment, the first wall 740 is used to mount the various electronics 800, although these could instead be mounted to the rear wall 730. In some embodiments, electronics 800 may be mounted to both the first wall 740 and the second wall 730. The top wall 710 substantially prohibits airflow from entering the plenum. An opening 120 is preferably placed on or near the top wall 710 to allow airflow 575 to enter the gap defined by the opening of the space between the first wall 740 and the rear of the LED backlight 220. In a similar manner, another opening (not shown here) is preferably provided on or near the top wall 710 to allow airflow 550 to enter the gap defined by the opening of the space between the second wall 730 and the rear of the LED backlight 420.

A gasket 700 is preferably positioned around the perimeter of the first wall 740 so that the gasket 700 is compressed between the plenum walls (top wall 710, bottom wall 715, and pair of opposing sidewalls) and the second wall 730 when the unit is closed. Preferably, a pair of dividing walls 80/85 are used to define a loop around the plenum 500 which may contain circulating gas and passes through only one of the dividing walls (here 80). Generally speaking, the dividing walls 80/85 should connect between the first wall 740 and second wall 730 of the plenum. In an exemplary embodiment, dividing wall 80 is perpendicular to dividing wall 85. Even more preferably, dividing wall 80 is arranged horizontally and contains the fan(s) while dividing wall 85 is connected to the end of dividing wall 80 but is arranged vertically and does not contain a fan. Although fans are only shown within the dividing wall 80, they could instead be placed within the dividing wall 85, or only within the dividing wall 85 with no fans placed within dividing wall 80. For exemplary airflow, it has been discovered that placing the first fan 75 near the center of the display assembly and the second fan 77 near the perimeter of the display assembly, causes a pair of circulating gas loops 501 and 510 respectfully.

A plurality of input/output electrical connections 25 are preferably placed at the top of the display assembly 201 and underneath a sloped rain catcher 705. Also, a pair of mounting pins 50 and 51 are arranged at the top of the display assembly 201. A plurality of latches 120, 122, 125 are preferably arranged at the bottom of the display assembly 201, although shown with three latches embodiments can be practiced with one or two latches only. Also shown in this figure are the attachment brackets 900 and 910 for gas springs 850 or other supporting resistive elements.

Figure 9:
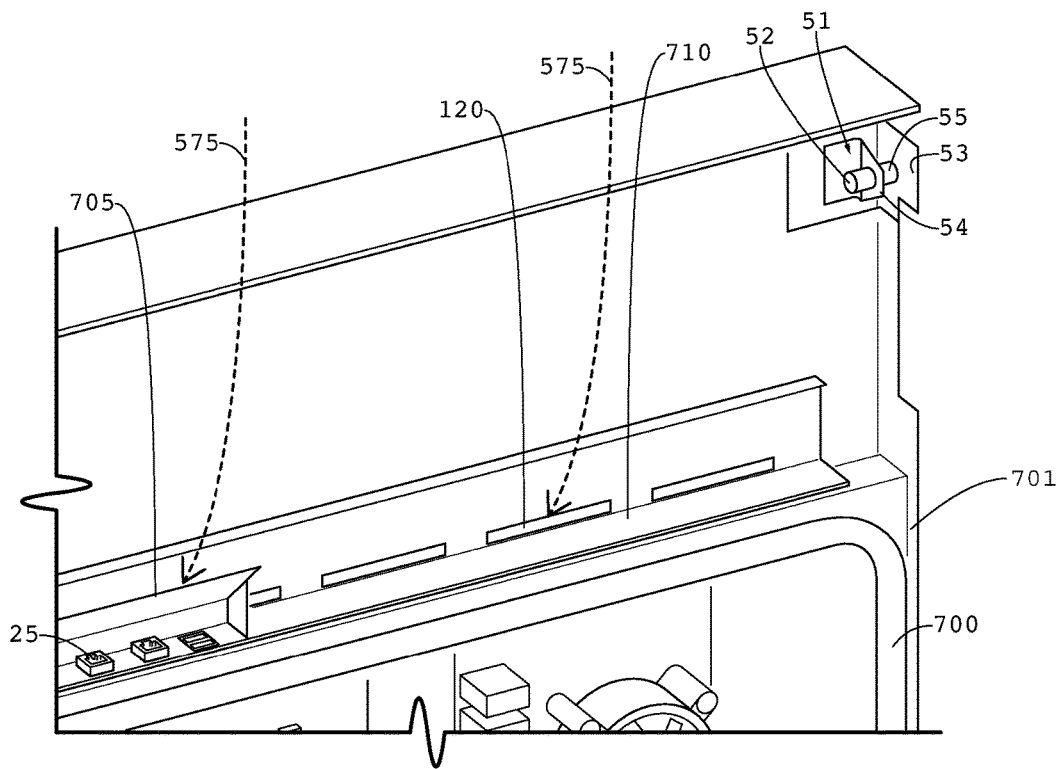
FIG. 9 is a detailed perspective view of Detail 9 showing the post.

FIG. 9 is a detailed perspective view of Detail 9 showing the post. Here, the details of the post 51 may be observed. In this embodiment, a cylinder travels horizontally and is divided by two locating walls 53 (closest to the perimeter of the display assembly 201) and 54 (closest to the center of the display assembly 201). The cylinder can then be identified by the mounting portion 55 (located between walls 53/54) and the interior portion 52 (starting at the wall 54 and travelling towards the center of the module 500).

Figure 10:
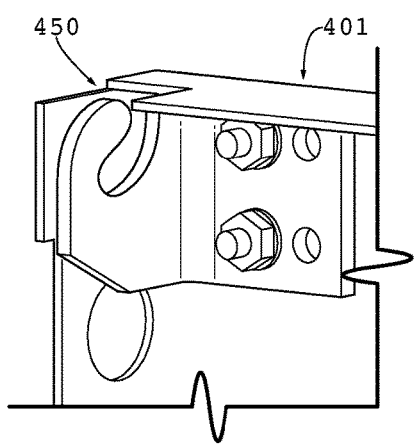
FIG. 10 is a detailed perspective view of the corresponding hook on the second display assembly.

FIG. 10 is a detailed perspective view of the corresponding hook 450 on the second display assembly 401. A pair of mounting hooks 450 are preferably placed at the top of the second display assembly 401 and correspond to the mounting posts 50 and 51 respectively. Preferably, the hook 450 would wrap around the circumference of the mounting portions 55, where the hook 300 is stabilized between the walls 54 and 53.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

We claim:

1. A back to back electronic display assembly comprising:
   a first display assembly positioned back to back with a second display assembly;
   an enclosed chamber positioned entirely between the first and second display assemblies, wherein said enclosed chamber is substantially sealed to prevent circulating air located within the enclosed chamber from exiting the enclosed chamber;
   a first gap defined between the enclosed chamber and the first display assembly;
   a second gap defined between the enclosed chamber and the second display assembly; and
   a fan positioned to force external air through the first and second gaps.

2. The assembly of claim 1 further comprising:
   a chamber fan positioned within the enclosed chamber.

3. The assembly of claim 1 wherein:
   one or more electronic components for operating the first display positioned within the enclosed chamber.

4. The assembly of claim 3 wherein:
   the electronic component is a power module.

5. The assembly of claim 1 wherein:
   the enclosed chamber comprises a first wall and second wall which oppose each other, a top wall, bottom wall, and a pair of sidewalls.

6. The assembly of claim 5 further comprising:
   a gasket positioned between the top wall and the second wall.

7. The assembly of claim 1 wherein:
   the second display assembly is permitted to move relative to the first display assembly.

8. The assembly of claim 5 wherein:
   the first wall is fixed relative to the first display assembly; and
   the second wall is fixed relative to the second display assembly.

9. The assembly of claim 5 wherein:
   the first gap is further defined between the first wall of the enclosed chamber and an LED backlight for the first display assembly; and
   the second gap is further defined between the second wall of the enclosed chamber and an LED backlight for the second display assembly.

10. The assembly of claim 1 further comprising:
    a first dividing wall positioned within the enclosed chamber; and
    a second dividing wall positioned within the enclosed chamber and oriented substantially perpendicular to the first dividing wall.

11. The assembly of claim 10 further comprising:
    a chamber fan positioned within the first or second dividing wall.

12. A back to back electronic display assembly comprising:
    a first LED backlit display positioned back to back with a second LED backlit display;
    an enclosed chamber positioned entirely between the first and second LED backlit displays and comprising:
    a first wall which faces a first LED backlight,
    a second wall which faces a second LED backlight,
    a top wall,
    a bottom wall, and
    a pair of sidewalls which extend between the first wall and the second wall,
    wherein said enclosed chamber is substantially sealed from external air;
    a first gap defined by the space between the first wall and the first LED backlight;
    a second gap defined by the space between the second wall and the second LED backlight;
    an electronic component attached to the first wall or second wall;
    a first fan positioned to force external air through the first gap and the second gap;
    a dividing wall positioned within the enclosed chamber that connects between the first wall and second wall of the enclosed chamber;
    a second fan positioned on the dividing wall for moving circulating gas through the enclosed chamber; and
    an additional dividing wall within the enclosed chamber which is connected to the first dividing wall and connects between the first wall and second wall of the enclosed chamber.

13. The assembly of claim 12 wherein:
    the first wall is fixed relative to the first display; and
    the second wall is fixed relative to the second display.

* * * * *

UNITED STATES PATENT AND TRADEMARK OFFICE
CERTIFICATE OF CORRECTION

| | | |
|---|---|---|
| PATENT NO. | : 10,194,564 B2 | Page 1 of 1 |
| APPLICATION NO. | : 14/700519 | |
| DATED | : January 29, 2019 | |
| INVENTOR(S) | : William Dunn et al. | |

It is certified that error appears in the above-identified patent and that said Letters Patent is hereby corrected as shown below:

In the Specification

Column 3, Line 18, please delete "10000" and insert -- 1000 --.

Signed and Sealed this
Twenty-fifth Day of August, 2020

Andrei Iancu
*Director of the United States Patent and Trademark Office*